United States Patent [19]
VanDerStuyf

[11] Patent Number: 4,829,255
[45] Date of Patent: May 9, 1989

[54] PROBE FOR SEALED CONNECTOR

[75] Inventor: Allen F. VanDerStuyf, Kernersville, N.C.

[73] Assignee: AMP Incorporated, Harrisburg, Pa.

[21] Appl. No.: 53,458

[22] Filed: May 22, 1987

[51] Int. Cl.$^4$ .............................................. G01R 31/04
[52] U.S. Cl. ................................... 324/538; 324/72.5; 324/158 P; 324/158 F; 439/482; 439/850
[58] Field of Search .............. 324/538, 539, 66, 158 P, 324/72.5, 158 F, 65 P, 65 CP, 65 CR; 439/586, 587, 588, 589, 282, 278, 279, 142, 702, 707, 912, 482, 845, 850, 858

[56] References Cited

U.S. PATENT DOCUMENTS

| | | | |
|---|---|---|---|
| 1,290,153 | 1/1919 | Fitzpatrick | 439/410 |
| 2,408,045 | 9/1946 | Cottrell | 439/409 |
| 3,037,183 | 5/1962 | Hopkins | 439/845 |
| 3,332,053 | 7/1967 | Busler | 439/596 |
| 3,538,436 | 11/1970 | Weeks et al. | 324/72.5 |
| 3,718,859 | 2/1973 | Arlow | 324/72.5 |
| 3,727,174 | 4/1973 | Podmore et al. | 439/596 |
| 4,068,170 | 1/1978 | Chayka et al. | 324/72.5 |
| 4,525,802 | 6/1985 | Hackamack | 361/399 X |
| 4,550,964 | 11/1985 | Donais et al. | 439/142 |
| 4,654,580 | 3/1987 | Keller | 324/DIG. 1 |

FOREIGN PATENT DOCUMENTS 2711709 9/1978 Fed. Rep. of Germany ...... 439/845

Primary Examiner—Reinhard J. Eisenzopf
Assistant Examiner—Robert W. Mueller
Attorney, Agent, or Firm—Eric J. Groen

[57] ABSTRACT

An electrical probe includes a base member and a cover member, the base member including a plurality of channels disposed therealong on an upper surface of the base member. The base member also includes a plurality of electrical terminals disposed in apertures below the channels, with resilient contact portions aligned along a front edge thereof. The probe is profiled for use with an electrical connector which has a retractable seal exposing portions of the terminals within the connector. The probe is aligned with the connector housing, the housing and probe cooperatively providing polarization to align the terminals within the probe with the individual insulated conductors which lead into the electrical connector and the cover member is placed over the base member to trap the insulated conductors between the base and the cover and resiliently bias electrical terminals of the probe against the extending portions of the connector terminals.

11 Claims, 9 Drawing Sheets

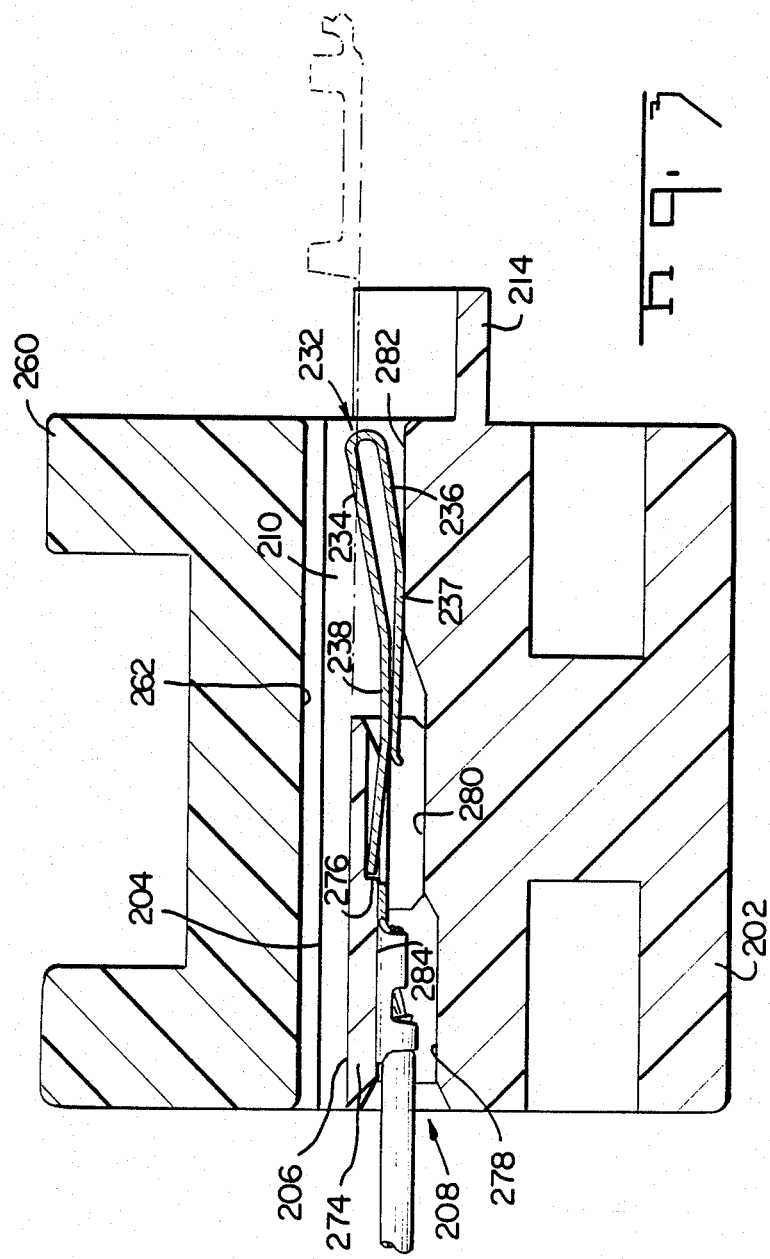

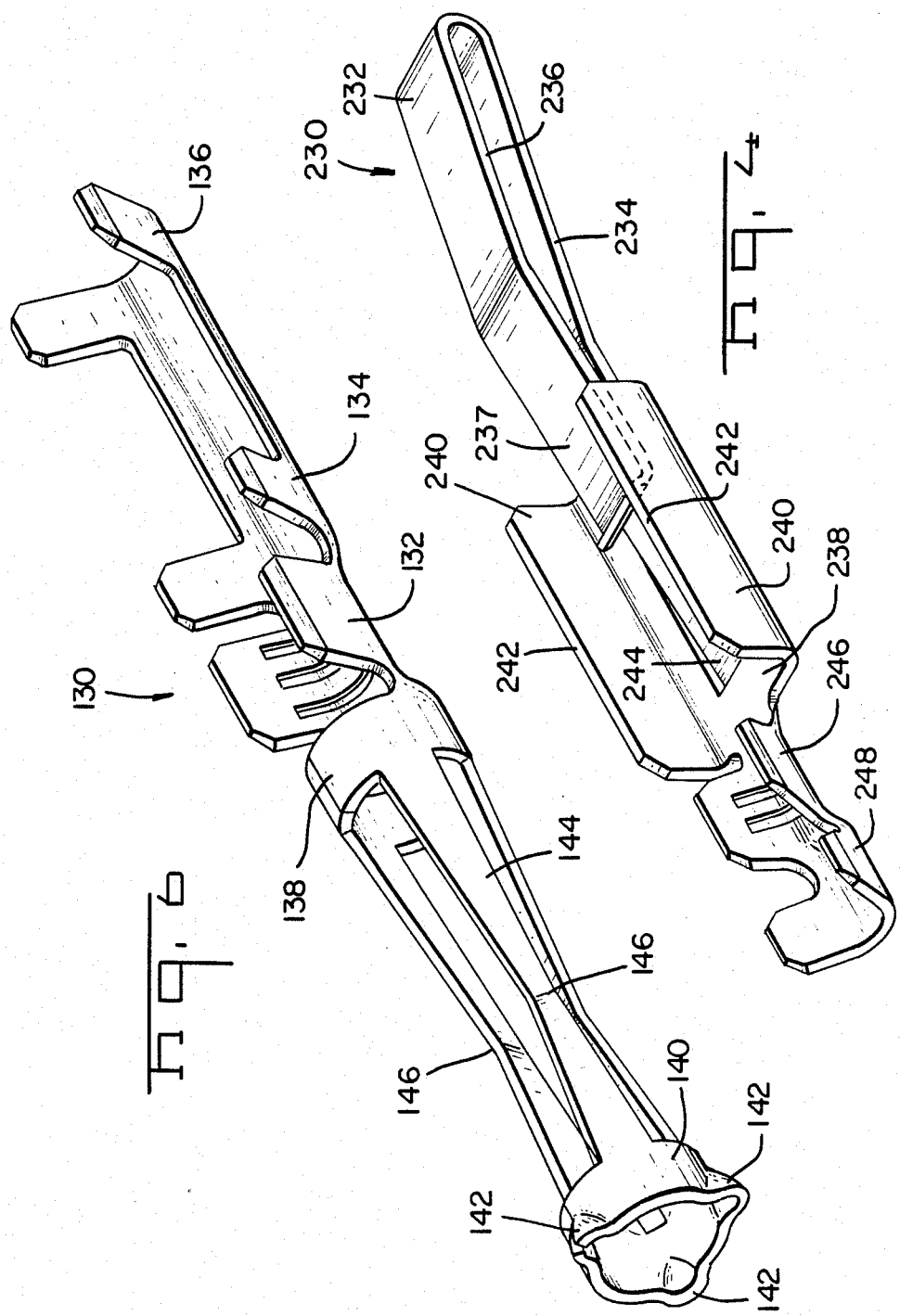

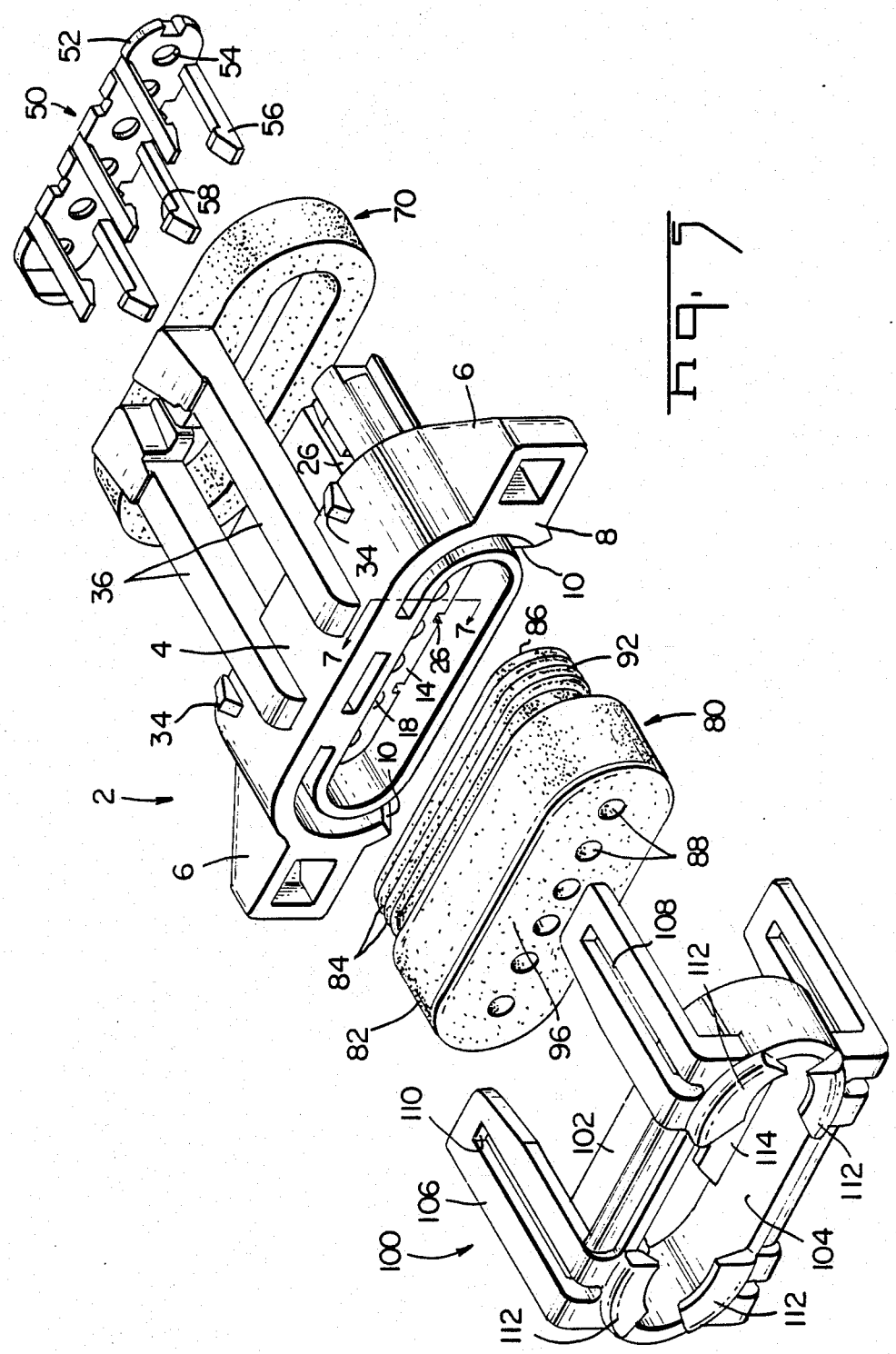

PROBE FOR SEALED CONNECTOR

BACKGROUND OF THE INVENTION

1. Field of the Invention

The instant invention relates to a probe for a sealed connector which has a retractable seal for exposing the terminals within the connector for probing. The probe can be electrically and mechanically attached to the electrical connector while the electrical connector is interconnected to a matable receptacle, the probe having resilient contacts therein which bias against the electrical terminals in the connector.

2. Description of the Prior Art

Electrical connectors are often times used outside or otherwise in environments which cause corrosion and the like, which eventually causes discontinuity between at least some of the electrical connections, thus connectors of this type should be sealed, protecting the electrical connection from the hazardous environments and resultant corrosion. Often times when a system becomes inoperable, a possible checkpoint is the electrical connection between the mating electrical connections. However to check the electrical connection, the mating electrical connectors must be disengaged, which could temporarily remedy the situation, as the wiping action between the electrical components during disengagement, could clean the mating electrical components sufficiently enough to temporarily recreate an electrical circuit.

Thus it is desirable to have an electrical connector which is sealed, preventing any stages of corrosion and resultant discontinuity between the electrical mating components. It is also desireable to have a means of probing the connector without having to disconnect the mating electrical connectors, if the system, which is interconnected by the electrical connector becomes inoperable.

One method of testing a faulty electrical circuit, presently utilized within the art, is shown in U.S. Pat. No. 3,718,859. This test element is actually a mating connector which is interconnected between the mating electrical connectors. However to utilize such a test element, the mating connectors to which the system is interconnected, must be disconnected, and the test element inserted between the two disconnected mating electrical connectors. If the connection between the mating connectors is faulty, the wiping action on the mating electrical terminals caused by disconnecting the mating connectors may be sufficient to complete the electrical connection between each of the disconnected electrical connectors and between the respective portion of the reconnected test element. it may also be possible that an electrical connection can be made between the test element and the electrical connectors, but when the electrical test element is removed and the electrical connectors replaced, the electrical connectors still do not mate or contact each other properly to create an unimpeded electrical connection.

Another method of testing electrical connections which is known in the art is disclosed in to U.S. Pat. No. 4,408,045. However this method relates to piercing through the insulation of the insulated conductors using two piercing pins which will sever the insulation. This method is not adaptable for use in a situation where the system must be kept moisture proof as the very piercing of the insulation by the pins severs the insulation such that when the line tester is removed the conductor is exposed to the atmosphere in which the system is operating.

Other methods of testing inoperable systems include disconnecting the mating connectors which interconnect the system, and testing each half of the system which is disconnected. However, some systems fail to function properly only under certain operating conditions of the system, and therefore to test such a system, the system must be operational while the test is made. If the interconnection between the mating connectors is broken to make the test, the system, is per se not operating under its normal operating conditions.

SUMMARY OF THE INVENTION

It is an object of the instant invention to design a probe which has a plurality of channels spaced for aligning with a plurality of insulated conductors, and which is axially movable relative thereto.

It is an object of the instant invention to have a probe which includes a rotatable latching means which can overlap the insulated conductors to secure electrical contacts of the probe with the electrical terminals within the electrical connector.

It is a further object to include in the probe a contact having high resiliency to assure an electrical connection with the terminals within the electrical connector, such that the system can be operated while testing.

The above mentioned objectives were met by designing an electrical probe having an insulative body with a plurality of channels disposed therein in a side-by-side relationship for receiving a like plurality of insulated conductors. The probde further includes an electrical terminal therein having a resilient contact portion for contacting a portion of the electrical terminal of the electrical connector.

The preferred embodiment of the invention includes a probe contact which comprises a flat blade portion which abuts an upper surface of the aperture in which the contact resides, and is thereafter U-shaped and reversely bent upon itself to contact the first blade portion, and the floor of the channel in which the U-shaped contact portion resides.

BRIEF DESCRIPTION OF THE DRAWINGS

FIG. 3 is a cross sectional view through line 3—3 of FIG. 1 showing the original vertical position of the terminal in phantom.

FIG. 4 is an isometric view of the probe terminal.

FIG. 5 is an isometric view of the electrical connector showing the connector components exploded away from the connector body.

FIG. 6 is an isometric view of the terminal of the electrical connector.

DETAILED DESCRIPTION OF THE PREFERRED EMBODIMENT

Figure 1:
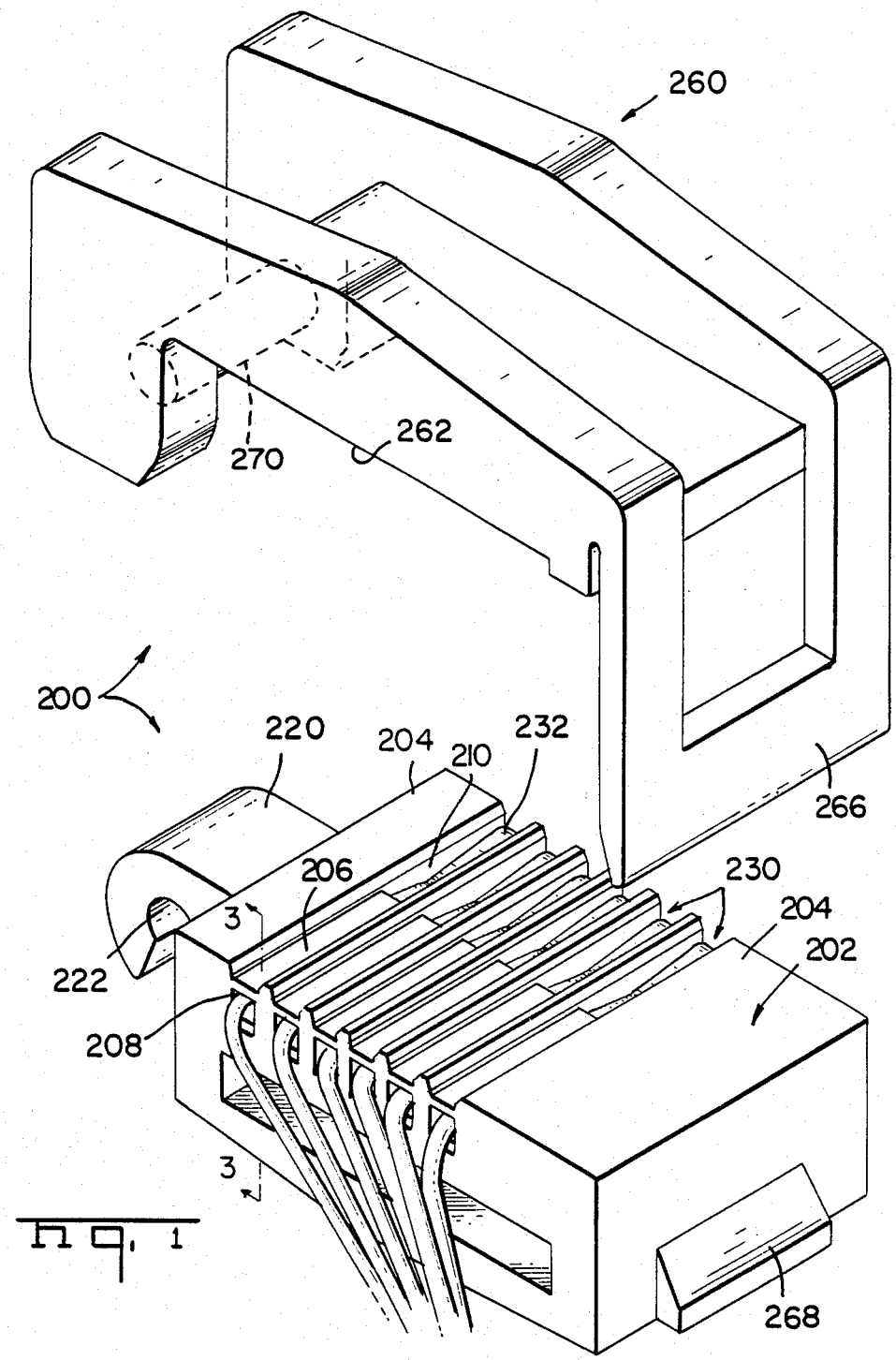
FIG. 1 is an isometric view of a probe which is used to probe the electrical terminals of the instant invention, when the seal is in the retracted position of FIG. 2.

FIG. 1 shows the probe 200 of the instant invention as including a body member 202 and a cap member 260, the body member 202 generally including a plurality of apertures 208 situated side-by-side having a channel portion 206 aligned with and disposed above the apertures 208, a second channel portion 210 being continuous with aperture 208. The probe further comprises a plurality of terminals 230 disposed within the apertures 208 and have contact portions 232 which reside in the channels 210. The probe is alignable with individual insulated conductors of an electrical connector, such as that shown in FIG. 2, when the seal 80 and seal cap 100 are in the retracted position.

With reference still to FIG. 1, the cap member includes a dowel portion 270 while the body portion 202 includes a semi-circular portion 222 which receives the dowel allowing the cap member to rotate therearound from an unlatched position to a latched position via latch arm 266 and latch detent 268.

Referring now to FIG. 4, the probe terminal is shown in greater detail as including a plate or blade portion 238 with arms 240 upstanding therefrom. The plate portion 238 is then continuous with a first arm portion 234 which is then reversely bent to form a second arm portion 236, the first 234 and second 236 arms cooperatively defining a U-shaped contact portion 232. A portion 237 extends from the second arm portion 236 and lies adjacent to the plate portion 238 in a contacting relation therewith. The plate portion 238 further includes a lance 244 struck outwardly therefrom, and crimp portions 246 and strain relief portions 248 extending forwardly thereof.

With reference now to FIG. 3, the probe is shown in cross-section through one of the terminals and through one of the terminals receiving cavities. The aperture 208 is defined by an upper wall portion 274 which includes an upper ceiling surface 284 and a floor 278. The upper surface 284 also includes a latching surface 276. The lower surface 278 includes a first stepped portion 280 and a second stepped portion 282. With the terminal installed as shown in FIG. 3, the plate portion 238 of the terminal lies adjacent to the upper surface 284 while the edges 242 (FIG. 4) of the upstanding arms 240 abut the first stepped portion 280. The struck out lance 244 resides in the latching recess 276 preventing axial movement of the terminal. The U-shaped contacting portion 232 resides within the channel 210 with the reversely bent portion 237 sandwiched between the floor 282 at its front section and between the plate portion 238 at it rear section. Thus when a downward contact force is exerted on the contact portion 232 towards the floor 282, an upward normal force is applied on the terminal portion 237 from the floor 282 and a downward force is applied to the terminal portion 237 by the terminal portion 238, which increases the rotational resistance of the terminal contact portion 232, thereby increasing the resiliency of the terminal contacting portion.

Figure 2:
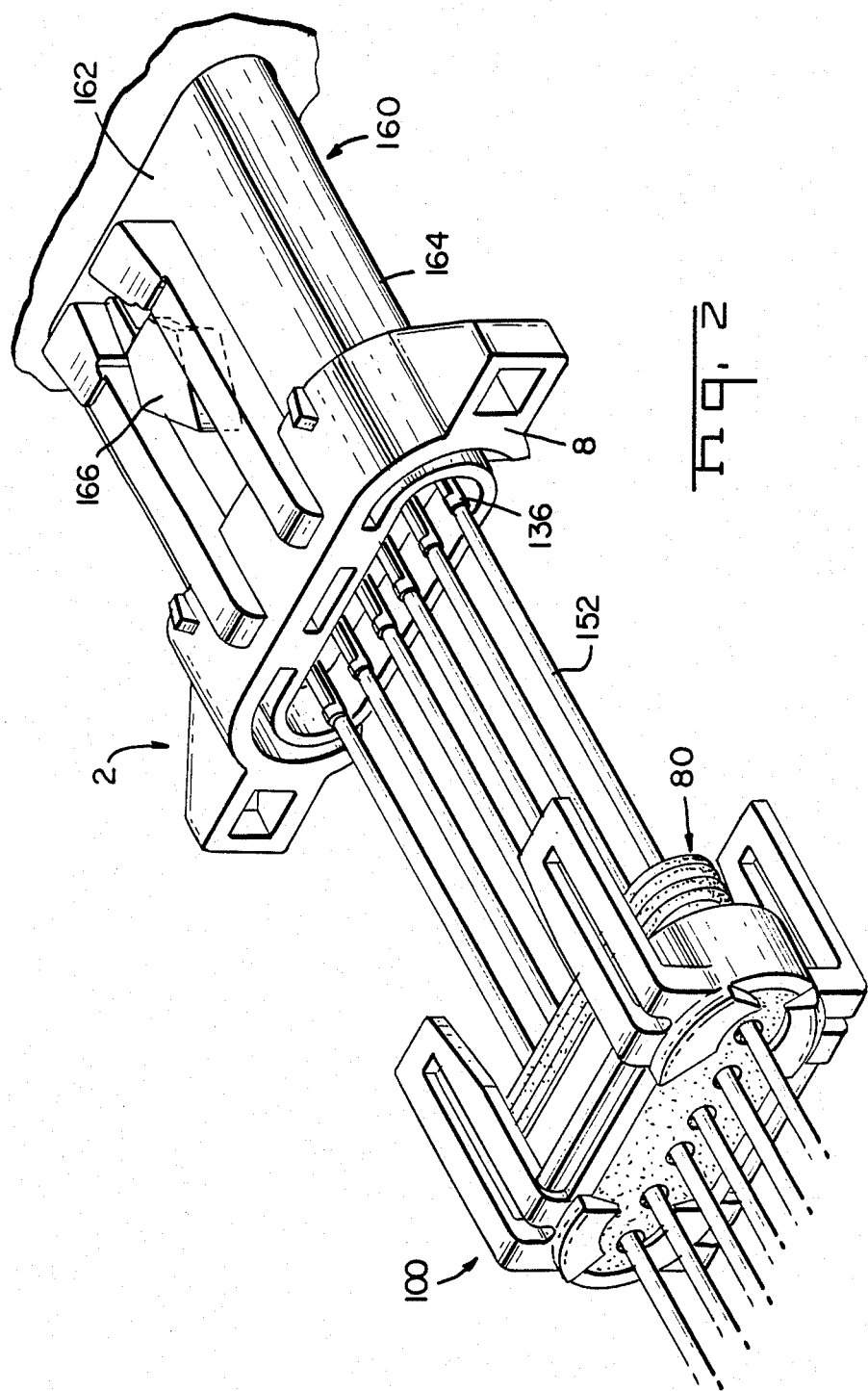
FIG. 2 is an isometric view showing the seal of the electrical connector in a retracted position for probing, while the electrical connector remains in a mated condition with the electrical receptacle.

To best understand the conditions under which the probe is to operate, a connector for use with the probe of the instant invention, will be generally described with reference to FIGS. 5–8, although the connector as shown in FIG. 2, is descirbed in more detail in pending application Ser. No. 134,325 entitled "Probeable Sealed Connector", filed concurrently herein; the disclosure of which is incorporated herein by reference.

With reference first to FIG. 5, the electrical connector generally includes an insulative body member 2 having an interfacial seal member 70 disposed at a front face thereof and an end cap 50 which provides a location and retention feature for electrical terminals (not shown) which will be positioned within apertures of the insulative body. The electrical connector further includes a retractable seal member 80 and a sealing cap 100.

An internal cavity is defined by an inner peripheral surface 12 and a rear wall 14, the peripheral surface extending from a face 8 to the rear wall 14. The rear wall 14 includes a plurality of apertures 18 extending therethrough for receipt of a like plurality of electrical terminals which will be described in greater detail later. The insulative housing 4 further includes two latching arms 36 extending forwardly therefrom, two latching protrusions 34 are included on the upper surface of the housing 4 and two latching protrusions 34 (not shown in FIG. 5) are located on the under side of the housing member 4, symmetrically located as the upper latching protrusions 34.

Referring still to FIG. 5 shows that the end cap 50 includes a latching plate 52 with a plurality of latching arms 56 extending fowardly therefrom. The latching plate also includes a plurality of apertures 54 through the plate, each aperture being in alignment with one of the apertures 18 within the housing 4. It should be noted that when the end cap 50 is inserted over the nose portion 34 of the housing, the latching surfaces 58 are securely fastened behind latching surfaces within the channel 26 of the housing.

Figure 8:
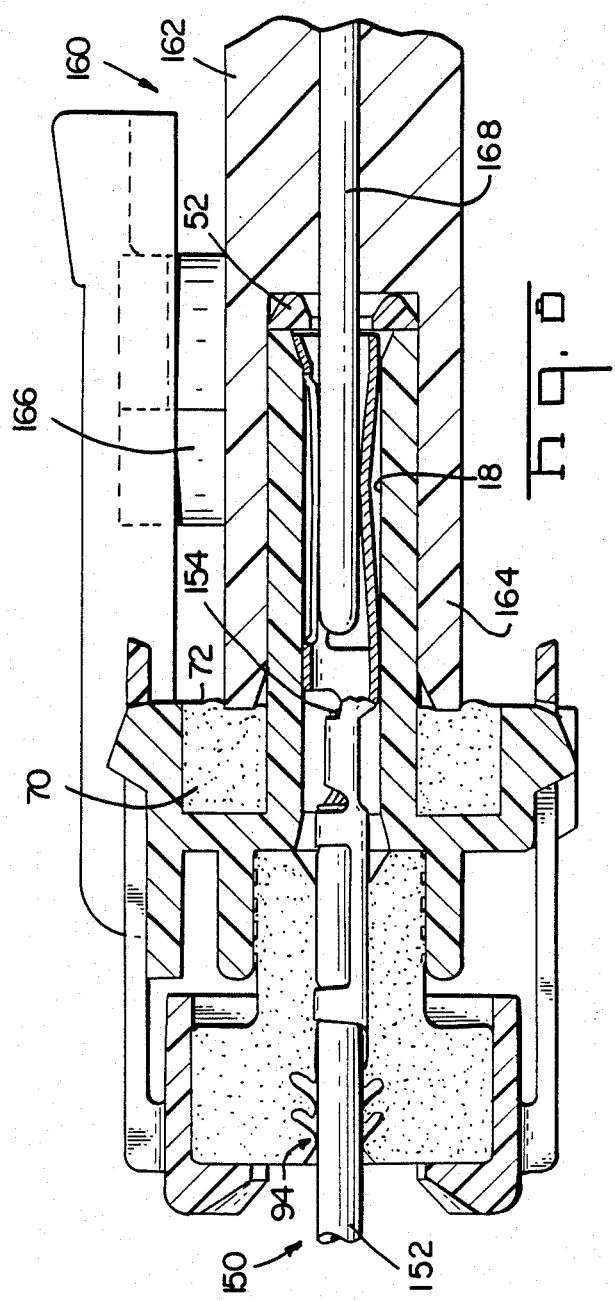
FIG. 8 is a cross-sectional view similar to that of FIG. 7 showing the connector mated with the electrical receptacle.

FIG. 5 shows the retractable seal 80 as generally comprising a body portion 82 with a protruding portion 92 extending forwardly therefrom, the protruding portion 92 including a plurality of peripherally extending ribs 84 in a surrounding relationship. The seal member 80 further includes a plurality of apertures 88 extending between a rear surface 96 and a forward surface 86, the apertures being spaced and profiled for alignment with the plurality of apertures 18 within the housing body 4 and with the apertures 54 in the end cap 50. As best shown in FIG. 8, the interior portions of the apertures include sealing ribs 94 which are profiled for sealingly surrounding insulated conductors which extend through the seal member 80.

As shown in FIG. 5, the end cap 100 generally comprises a body portion 102 which includes an inner cavity defined by the inner peripheral surface 104, the surface 104 being oval shaped to surround the body portion 82 of the seal member 80. The body portion 102 of the cap 100 further includes four latching arms 106 extending from the sealing body 102, the latching arms including slots 108 which define latching surfaces 110. The end cap 100 also includes outer retaining fingers 112 and inner retaining fingers 114 which are integrally molded with the end cap 100. It should be noted that the inner retention fingers 114, although axially spaced from the outer retention fingers 112, are conveniently positioned between two outer retention fingers 112 so as to allow a single draw molding technique in the molding of the seal cap 100.

The electrical connector further comprises a plurality of electrical terminals 130, as shown in FIG. 6, and generally includes a wire connecting portion at one end and a contacting portion at the opposite end. The wire connecting portion includes a crimp portion 132, a strain relief portion 134, and an extended probing portion 136. At its opposite end, the contacting portion of the terminal comprises a cylindrical band portion 138, and a forward band portion 140 with a plurality of resilient beam sections 144 extending therebetween. Each of the beam sections 144 bows inwardly, at 146, to form a constricted section to bias against a pin when inserted. The forward band portion 140 further includes outwardly formed retention portions 142 at the forward end thereof.

Figure 7:
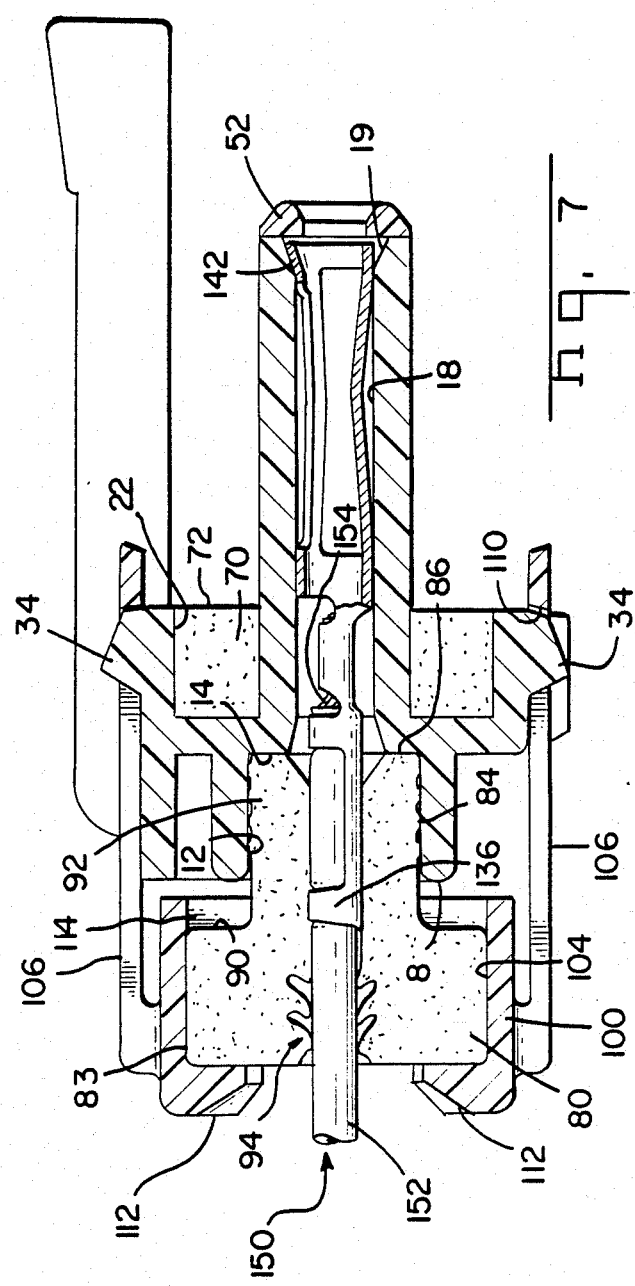
FIG. 7 is a cross-sectional view through lines 7—7 of FIG. 5 with the connector components assembled.

With the terminals 130 installed as shown in FIG. 7, the seal member 80 including the seal cap 100 is slidable forwardly relative to the insulated conductors to seal the internal portions of the electrical connector. Conveniently, and as shown in FIG. 4, the inside edges 116 of the latch arms 106 are profiled to closely fit between the outside edges 38 of the latching arms 36, which aligns the seal forward portion 92 with the cavity of the housing. The edges 116 of the latching arms 106 begin to meet the edges 38 of the latch arms 36 prior to the forward surface 86 of seal reaching the cavity, assuring proper alignment of the seal portion 92 with the cavity prior to the insertion thereof, thereby preventing any possible damage to the sealing ribs 84.

In FIG. 7, the seal member 80 is shown as being inserted into the seal cap 100 such that the rear surface 96 and the forward surface 90 of the seal member 80 are trapped between the rear 112 and forward 114 retention fingers of the seal cap 100. The peripheral surface 83 of the seal member 80 is also tightly retained within the internal surface 104 of the seal cap, which slightly compresses the seal, and gives the seal body 82 some rigidity, allowing the seal member 80 to be more easily managed when sliding it forwardly and rearwardly.

As shown in FIG. 6, when the forward portion 92 of the seal 80 is inserted with the cavity, the peripheral ribs 84 are deformed against the internal peripheral surface 12 of the insulative housing 4 and the forward surface 86 of the seal member 80 is in an abutting relation with the rear wall 14 of the insulative housing 4. As best shown in FIGS. 5 and 7, the seal is retained in its forward position by latching arms 106 latching to the extensions 34 on the upper and lower surfaces of the insulative housing. Furthermore, the ribs 94 located within the apertures 88 of the seal member 80 are deformed around the insulation 152 of the insulated conductor 150. It should be noted that the seal 80 has two different axial sealing locations; a first between the sealing ribs 84 and inner peripheral surface 12, and a second between the sealing ribs 94 within the apertures 88 and the insulation of the insulated conductors 150. It should also be noted that the seal between the ribs 94 and the insulated conductors 150 is rearward of the extended portion 136 which allows retraction of the seal without the sealing ribs 94 having to slide over the portion 136, thereby possibly damaging the ribs 94. This also allows the extended portions 136 to be beyond the connector face 8 and accessible for probing, while still allowing the extended portion 136 to be sealed at a position beyond the rear face 8.

Figure 9:
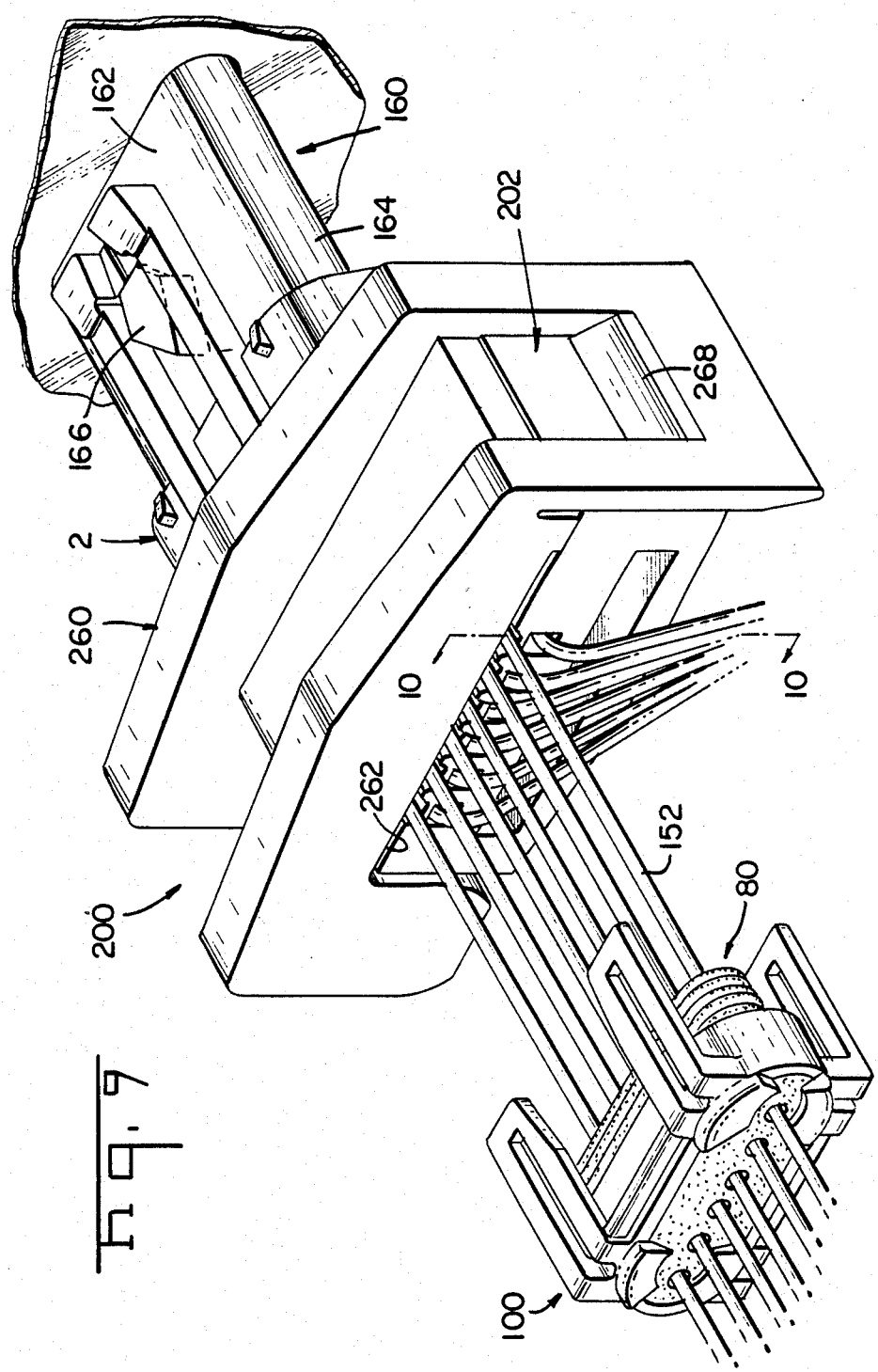
FIG. 9 is an isometric view showing the electrical connector in a mated condition with the electrical receptacle, with the seal of the electrical connector in a retracted position and with the probe in place to probe the terminals of the electrical connector.

With the seal and connector assembled as described above, the connector is matable with an electrical receptacle having a plurality of pins equal in number to the number of terminals within the connector 2. As shown in FIGS. 7 and 8, the connector 2 is matable with a header 160 which includes an insulative body 162 and a plurality of pins 168 equal in number with the plurality of terminals 130 within the connector 2. Each of the pins 168 protrude through the apertures 54 in the end cap 50 and reside within the apertures 18 in a contacting relation with the constricted portions 146 of the resilient beams 144 of the terminal. The header 160 includes a shroud portion 160 which extends peripherally so as to surround the nose portion of the connector and is profiled to interfere with the front face 72 of the interfacial seal 70 as shown in FIGS. 9 and 3, and deforming the same when in a latched position.

Figure 10:
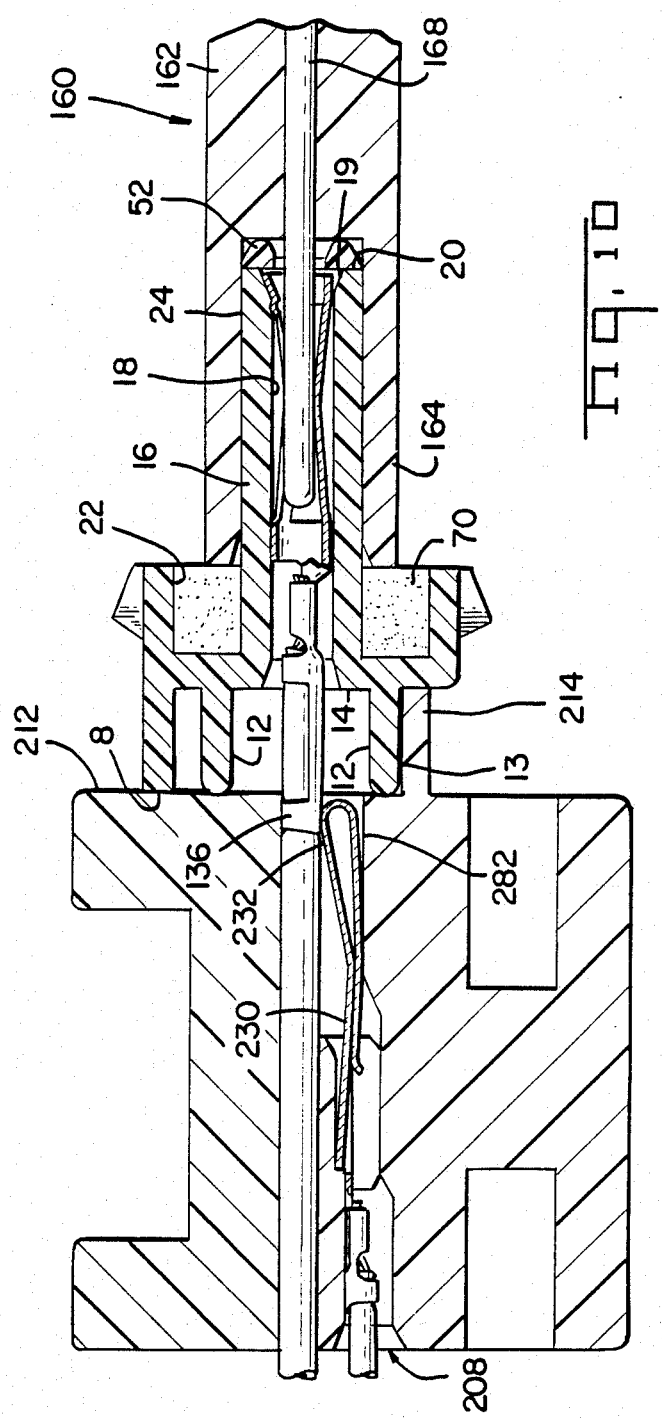
FIG. 10 is a cross-sectional view through lines 10—10 of FIG. 9.

To operate the probe mechanism of the instant invention with a connector as above described, the seal of the connector should be in the retracted position of FIG. 2. It should be noted that the channel portions 206 only extend partially across the top surface 204 of the body member 202 which exposes a resilient contact portion 232 of a terminal 230 which resides in the apertures 208. In this manner, the probe body portion 202 can be placed beneath the plurality of individual insulated conductors 152, as shown in FIG. 2, each insulated conductor 152 residing in a single channel 206 of the probe body member 202. The body member 202 should be placed against the rear face 8 of the connector such that the resilient contact portion 232 is in a contacting relationship with the extended portion 136 of the terminal 130, as shown in FIG. 10. The upper latch member 260 can then be placed over the individual insulated wires 150 and the dowel 270 of the upper latch member 260 can be placed within the semicircular portion 222 of the latch arm 220.

With the upper latch member in place, the upper latch member 260 can be rotated relative to the body member 202 until the latch arm 266 latches with the latching detent 240 on the body member 204. The distance between the under surface 262 of the latching member 260 and the channel 206 causes an interference fit therebetween on the insulated conductor. It should also be noted that the under surface 262 backs up the extended contact portion 136 of the terminal so that when the upper latch member 260 is latched in place on the body member, the resilient contact portion 232 biases towards the floor 210 of the aperture 208. In this manner, a good electrical connection is made between the resilient contact portion 232 of the terminal and the extended contact portion 136 and a mechanical strain relief is created between the probe and the insulated conductors retaining the probe in position. Thus, the connector and header can be used in their normal environment without the fear of the probe becoming disconnected from the connector 2.

It should also be noted that an open space is formed between the two edges 10 on the connector face 8 (FIG. 5), and a polarizing projection 214 extends from the front surface 212 of the probe and is profiled to fit in the recess when the front face 212 of the probe abuts the face 8 of the connector housing 4, as shown in FIG. 11. The projection polarizes the probe with the connector housing, assuring that the probe contacts are laterally aligned with the connector extended terminal portions. However, the probe is not secured to the connector vertically which allows the probe to vertically "float" thereby allowing the probe to vertically align itself with the extended terminal portions, rather than bending or overstressing the portions to accommodate the probe.

The advantage to the instant invention relates to its diagnostic testing characteristics. As shown in FIG. 2, the seal member 80 and the seal cap 100 can be retracted from the connector 2 which exposes the extended portions 136 of the terminals 130 for probing, and the probe 5 can thereafter be placed over the individual insulated conductors without having to remove the connector from the receptacle, or remove the seal 80 from the connector. It is important in an electrical connection to maintain the electrical connection between the mating connectors because if a fault is detected in a system and the electrical connection is broken, it may have been a corroded connection between the pins and terminals of the matable connectors themselves which caused the failure. By disconnecting the connector from the electrical receptacle, the wiping action between the pins and terminals could be sufficient to partially remove the corrosion, such that reconnecting the connector and receptacle temporarily removes the discontinuity. By probing the electrical terminals of the electrical connector at a position which is remote from the electrical connection between the electrical connector and the receptacle, the electrical connection between the connector and receptacle can be maintained.

Furthermore, many times the equipment to which the connectors are interconnected only malfunction at certain operating conditions. Therefore, the malfunction is easiest to find if the equipment is run in a natural operating condition.

When the diagnostic test is complete, the probe is removed and the seal is again replaced, the forward portion of the seal 92 inserted within the cavity of the connector. Thus the instant invention relates to an electrical probe which can be used as a diagnostic test probe in a connector which has a retractable seal.

The instant invention was described by way of preferred embodiment only and should not be taken to limit the claims which follow.

What is claimed:

1. An electrical probe for testing an electrical connection including a connector mated with a header, the connector having at least one electrical contact therein which is electrically connected to a conductor of an insulated wire, the connector having a retractable seal exposing the electrical contacts, the header including a mating contact which is electrically connectable with the connector contact, the probe comprising:
   a body portion having at least one wire receiving channel therein, the channel being profiled for slidable movement relative to the length of the wire, towards and away from the connector;
   an electrical terminal disposed within said channel having means for interconnection to an electrical conductor of a diagnostic wire, and resilient contact means for contacting the electrical contacts within the electrical connector;
   means to secure the body portion and the terminal to the insulated wire with the terminal of the probe in electrical connection with the contact of the connector;
   whereby, when the connector and the header are in mating electrical engagement, the seal of the connector can be retracted and the probe can be placed over the insulated wire and moved forwardly until the probe terminal and connector contact are electrically connected and the electrical connection between the connector and probe can be made without disturbing the electrical engagement of the connector and header.

2. The electrical probe of claim 1 wherein the securing means comprises a cap means which overlies said channel, trapping the insulated wire therein.

3. The electrical probe of claim 2 wherein the caps means is rotatable about an end of the body portion thereof for accessing the insulated wire which forms a part of the electrical system for the connector.

4. The electrical probe of claim 1 wherein the body portion includes a front face, a wire receiving face and a rear face.

5. The electrical probe of claim 4 wherein the wire receiving channel extends between the front and rear faces with the probe terminal disposed in the channel recessed from the front face.

6. The electrical connector of claim 4 further comprising polarizing means extending from the front face to polarize the probe with the connector.

7. An electrical probe for probing an electrical circuit having a plurality of insulated conductors terminated to a like plurality of electrical contacts, the probe comprising:
   a body portion having a front face, a rear face and a wire receiving face thereon, the wire receiving face extending along only a portion of the length between the front and rear faces, the wire receiving face including a plurality of channels therein, each channel having a floor surface thereon, the body portion further comprising a terminal receiving aperture disposed below each channel which communicates with an open channel which extends between an end of the wire receiving face and the front face;
   a plurality of terminals disposed in the body portion with a wire connecting portion disposed within the apertures and a resilient contact portion disposed within the open channels, with a portion of the resilient contact portions having an unbiased position above the plane defined by the floor surface; and
   cap means for overlaying the wire receiving face having a surface which is spaced from and faces the floor surface.

8. The probe of claim 7 wherein the resilient contact portion can be biased to a position below the plane defined by the floor surface.

9. The probe of claim 7 wherein the cap means is movable relative to the body portion so as to allow the probe to be placed under the plurality of insulated conductors without disturbing the electrical connection of the wires, and latchable to the body portion to secure the body portion axially relative to the wires.

10. The probe of claim 9 wherein the spacing between the surface of the caps means and the floor surface is profiled
    to trap therebetween an insulated wire which is placed within the channel.

11. The probe of claim 10 wherein the spacing between the surface of the cap means and a lower surface of the channel is profiled to trap therebetween an electrical contact which is electrically connected to the insulated conductor.

* * * * *